United States Patent [19]

Hokanson et al.

[11] Patent Number: 4,700,044
[45] Date of Patent: Oct. 13, 1987

[54] LASER SOLDERING APPARATUS AND METHOD

[75] Inventors: John M. Hokanson; Kenneth S. Bentz; Terrence G. Field, all of Hutchinson; David A. Ziegler, Darwin, all of Minn.

[73] Assignee: Hutchinson Technology Inc., Hutchins, Minn.

[21] Appl. No.: 892,789

[22] Filed: Jul. 31, 1986

[51] Int. Cl.⁴ .............................................. B23K 26/00
[52] U.S. Cl. ...................... 219/121 LC; 219/121 LD; 219/121 LU
[58] Field of Search ................ 219/121 LC, 121 LD, 219/121 EC, 121 ED, 121 L, 121 LM, 85 BA, 85 BM

[56] References Cited

U.S. PATENT DOCUMENTS

| | | | |
|---|---|---|---|
| 3,383,491 | 5/1968 | Muncheryan | 219/121 LC |
| 3,463,898 | 8/1969 | Takaoka et al. | 219/121 LC |
| 4,327,275 | 4/1982 | Asaba et al. | 219/121 LD |
| 4,327,277 | 4/1982 | Daly | 219/121 LD |
| 4,358,658 | 11/1982 | Van Blarigan et al. | 219/121 LC |
| 4,358,659 | 11/1982 | Spohnheimer | 219/121 LB |
| 4,424,435 | 1/1984 | Barnes, Jr. | 219/121 LD |
| 4,461,947 | 7/1984 | Ward | 219/121 FS |
| 4,531,044 | 7/1985 | Chang | 219/121 LM |
| 4,538,956 | 9/1985 | Kalkbrenner et al. | 414/735 |
| 4,547,651 | 10/1985 | Maruyama | 219/121 LG |
| 4,547,652 | 10/1985 | Raisig et al. | 219/121 LD |
| 4,574,180 | 3/1986 | Kasner et al. | 219/121 LY |
| 4,578,554 | 3/1986 | Coulter | 219/121 LC |
| 4,588,468 | 5/1986 | McGinty | 156/345 |
| 4,595,816 | 6/1986 | Hall et al. | 219/121 LD |

FOREIGN PATENT DOCUMENTS

| | | | |
|---|---|---|---|
| 0013490 | 1/1983 | Japan | 219/121 LM |
| 0037284 | 2/1985 | Japan | 219/121 LD |

OTHER PUBLICATIONS

Page 71 describes *Laser Soldering from Laakmann Electro-Optics, Inc.*
A Page entitled "Appollo Lasers-Laser Micro Soldering System", Bulletin No. APO-3311 from Apollo Lasers, Inc., of Chadsworth, Calif.
Article entitled "Soldering with Light", by Carl Miller, pp. 83–86, appear in Photonics Spectra of May 1983.

*Primary Examiner*—C. L. Albritton
*Attorney, Agent, or Firm*—Vidas & Arrett

[57] ABSTRACT

Fine wires are soldered without flux to solder pads on a flexible circuit of a workpiece by a laser. The laser beam is aligned and moved over the solder pad to describe a rectangle by movement of mirrors on a programmed, motor driven X-Y-Z linear table. Wires are deeply sunk into the solder pads by the weight of a cone brought against the wire carried by the X-Y-Z table. Vaporized insulation is restrained within the cone to maintain a clean microelectronic workpiece.

7 Claims, 7 Drawing Figures

LASER SOLDERING APPARATUS AND METHOD

I. DESCRIPTION

Field of the Invention

This invention relates to laser soldering of fine wires to a solder pad on a flexible polyimide or polyester substrate. More specifically, an automated system is presented which allows an operator to precisely solder insulated wires to solder pads on a polyimide substrate quickly, inexpensively, and without the need for flux.

BACKGROUND OF THE INVENTION

Laser beams have been used in a variety of applications including machining, welding, and soldering.

In U.S. Pat. No. 4,547,652 to Raisig et al, methods are shown for soldering flexible wire in which wires are laid on a transparent carrying film, flux is applied and a clamp of transparent material is added before the laser beam is applied as a heat source.

In U.S. Pat. No. 4,531,044 to Chang, a method for soldering lead strands to a printed electrical path is described in which lead strands are forced onto a soldering pad. A defocused laser beam is then applied to reflow a selected portion of the pad.

McGinty et al, U.S. Pat. No. 4,588,468 shows an apparatus for changing and repairing printed circuit boards in which a printed circuit board is moved within an X-Y positioning fixture to bring a specific location of the printed circuit board under one of the plurality of heads mounted above the work station surface. Some heads make cuts while others include laser beams for removing wire insulation. Additional heads lay down new conductive paths and glue. Solder paste is dispensed from another head and the soldering is accomplished by a laser controlled by a computer.

SUMMARY OF THE INVENTION

The present invention comprises an apparatus and methods for soldering a plurality of fine wires to solder pads on a flexible circuit board substrate. An operator clamps a part to a fixture and the fixture is placed on a conveyer. The fixture is then allowed to travel down the conveyer into a laser chamber in which the fixture is locked into position.

A relatively low power Nd:YAG laser having a wavelength which is readily absorbed by metals eliminates the need for flux. The laser is positioned on a table adjacent the conveyer. The beam from the laser is directed through two mirrors through a lens holder which has a lens for focusing the beam and finally through a truncated cone. The beam is positioned by moving the mirrors. The mirrors are mounted to X-Y-Z linear tables which allow the beam to be accurately positioned in relation to the work piece. The X-Y-Z tables are controlled by a programmable controller which directs the motors to the three separate tables.

An operator manually aligns the tables by use of the controller in a jog mode. Once the camera verifies that the beam passing through the truncated cone is aligned, the controller is put on automatic.

The X-Y-Z table lowers the cone such that the cone drops over the pad center onto the substrate, trapping the fine wire across the pad. No portion of the cone should preferably touch the pad itself. The weight of the cone pushes the wire into the pad. The laser shutter opens and the beam traverses a generally square path by movement of the mirrors on the X-Y-Z table. After the shutter closes there is a brief pause to allow some cooling before the cone is lifted from the pad. The laser beam simultaneously burns away the insulation on the wires and reflows the solder pad. A cone presses the now bare wire into the solder pad which provides an excellent solder connection. The time required per pad is on the order of a second or less.

The fixture, complete with wires laser soldered to the solder pads of the part, is then removed from the laser chamber. The part is removed from the fixture. Each wire is accurately soldered in position without damage to the flexible substrate. Contamination is kept to a minimum. The fine wires are deeply embedded in the solder pad. Each solder joint is consistent, clean and strong.

BRIEF DESCRIPTION OF THE DRAWINGS

A detailed description of the invention is hereafter described with specific reference being made to the drawings in which.

DETAILED DESCRIPTION OF THE INVENTION

Figure 1:
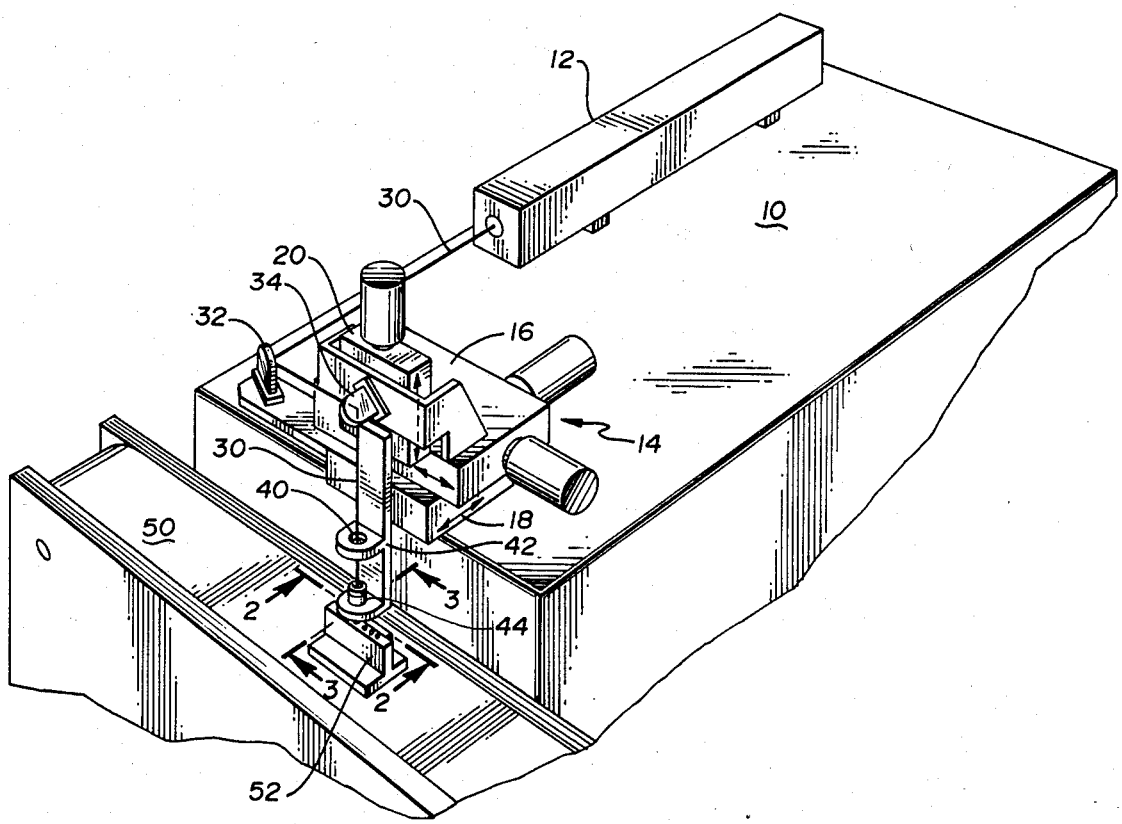
FIG. 1 is a perspective view of the laser soldering system of the invention.

With reference to the drawings, FIG. 1 shows the system for laser soldering fine wires to flexible circuit board workpieces. The system includes a machine base 10 on which a laser 12 is positioned. A precision controlled, motor driven X-Y-Z linear table 14 is secured to table or base 10.

Table 14 consists of three separate motor-driven tables, table 16 for horizontal, Y-axis movement, table 18 for horizontal, X-axis movement, and table 20 for vertical, Z-axis movement. Table 14 is precisely controlled by a program controller which drives the individual tables in whatever direction and distance required.

A laser beam 30 from laser 12 is directed against a first mirror 32 as shown. Mirror 32 is attached to table 18 and is movable along a Y-axis. A second mirror 34 is attached to table 16. Mirror 34 may be moved in a Y-axis by moving the table 16 or in an X-axis by movng table 18.

Figure 2:
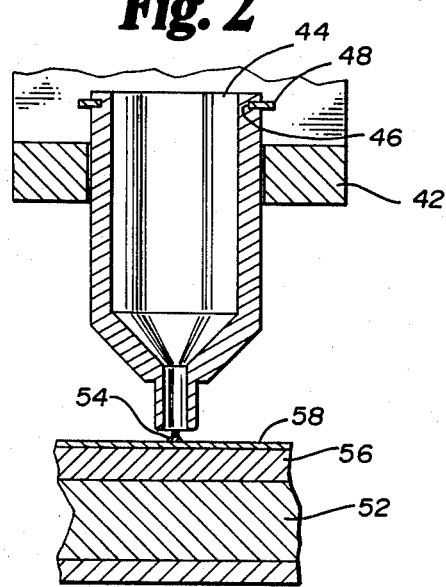
FIG. 2 is a cross-sectional view of the cone, holder, workpiece, and fixture taken along line 2—2 of FIG. 1.

The laser beam is directed downwardly from the second mirror through a focusing lens 40 which is rigidly held to a holder 42 attached to table 20. The beam then passes through a truncated cone 44 held to holder 42. Cone 44 freely slides up and down within holder 42. The length of vertical travel of cone 44 is limited to prevent the cone from escaping from the holder. A groove 46 and a snap-ring 48 may be used to prevent cone 44 from passing through holder 42 as shown in FIG. 2.

A conveyer 50 is positioned adjacent machine base 10 as shown. Conveyer 50 carries fixtures 52 underneath cone 44 where the laser beam 30 may be aligned onto a solder pad 54 on a workpiece 56 held to fixture 52.

Workpieces 56 include a thin flexible circuit 58 typically made of polyester or a polyimide such as Kapton V brand polyimide from DuPont Co., Industrial Films Division, Wilmington, Del. Alternatively, the substrate of the circuit may be glass-filled or any other conventional circuit board material. However, this invention is particularly adopted to handle soldering of workpieces having substrates which cannot handle a lot of heat during soldering. Fine wire 6 must be soldered to solid pads 54 on the flexible circuit 58 portion of the workpiece. The wires 60 are routed over the center of the solder pads 54.

Fixture 52 is positioned within a protective shroud (not shown) which covers the fixture, X-Y-Z table and laser. The shroud is used to avoid the need for special safety precautions required when laser beams are directly visible by the human eye.

Figure 5:
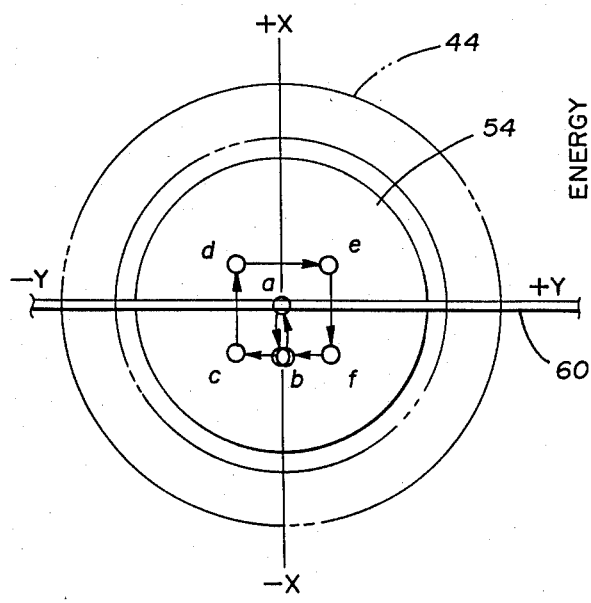
FIG. 5 is a top view of a solder pad transected by a wire with the movement of the laser beam shown by a dtted line.

After the protective shroud is closed, an X-Y-Z table control panel having coarse and fine adjustments for the X-Y-Z axes is used to position the cone so that it is centered over a pad 54 of the workpiece. The proper positioning of the X-Y-Z tables may be accomplished with the use of television monitors connected to television cameras within the shroud. Transparent overlays on the monitors may be used to indicate the area and location of laser radiation when activated. FIG. 5 shows a solder pad 54, wire 60 and beam movement a, b, c, d, e, f, b, a.

Figure 7:
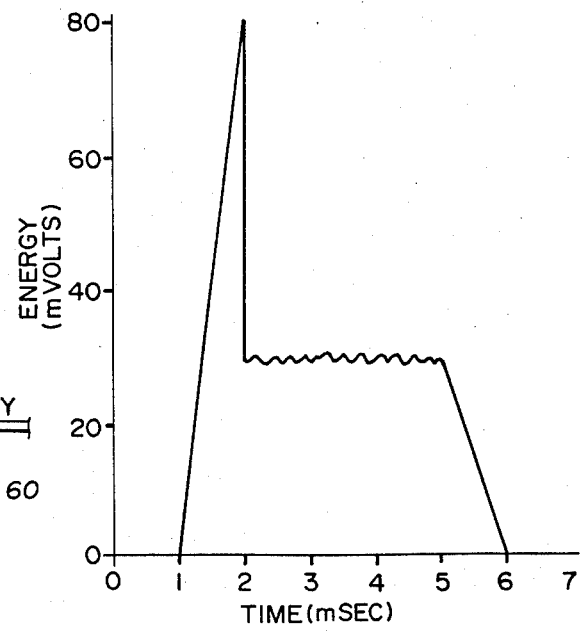
FIG. 7 is a graph showing the preferred pulse shape producible by the laser.

The laser 12 may be a Lumonics MS 810, pulsed, 100 watt, Nd:YAG laser. The 1.064 micron wavelength of such lasers is readily absorbed by metals, eliminating the need for flux. The transverse mode of the laser is multimode. The laser must have the capability of producing the pulse shape as shown in FIG. 7. A pulse rate of 35 pulses/second +/−5 pulses, pulse width of 5 milliseconds +/−1 millisecond, and pulse shape as shown in FIG. 7 within +/−20% is preferred for pads of about 0.010–0.080 inches in diameter and wires of 0.001–0.008 inches in diameter.

Figure 3:
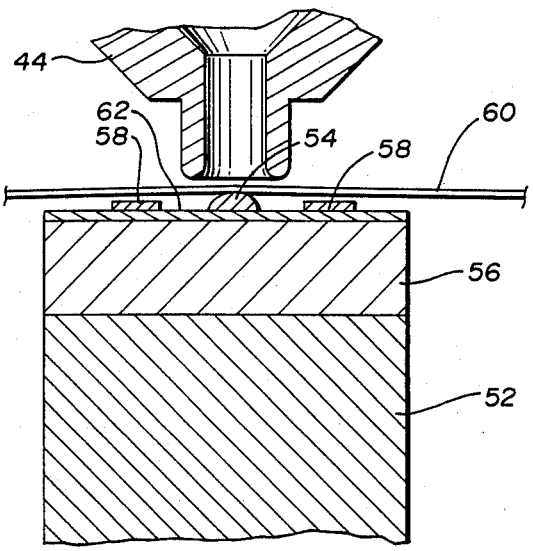
FIG. 3 is an enlarged sectional elevation of the wire fixture and cone of FIG. 1 through lines 3—3 through a solder pad of the workpiece.
Figure 4:
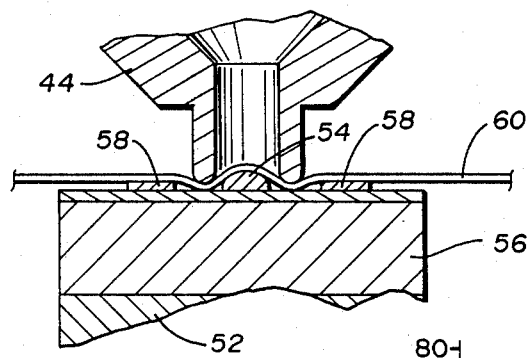
FIG. 4 is a sectional elevation similar to that of FIG. 3 with the cone depressed onto a wire.

The cone 44 is dropped over the center of the pad as shown in FIG. 3. Cone 44, as shown, has an interior bore through which the laser beam 30 passes, the bore being about the same diameter as the pad. The outside diameter of cone 44 at the end which contacts wire is less than the diameter of the opening 62 punched into the flexible polyimide or polyester of the flexible circuit 58. In this manner, the diameter of cone 44 at the end which contacts wire is less than the diameter of the opening 62 punched into the flexible circuit 58. The cone enters opening 62 as shown. The weight of cone 44 is applied to wire 60 so as to push the wire onto the pad as shown in FIG. 4. Cone 44 serves to shield the surrounding portions of the polyimide or polyester substrate from damage due to the laser generated heat.

A shutter of the laser is opened and the program controller of the X-Y-Z table preferably causes the beam 30 to traverse a square path as shown in FIG. 5 such that the beam traverses points a, b, c, d, e, f, b a. Although the rectangular beam movement is preferred and provides the best solder reflowing, other beam patterns may provide acceptable results. The heat generated vaporizes any insulation on wires 60 within the confines of the cone and reflows the solder. Of course, bare wire may be used rather than insulated wire.

Figure 6:
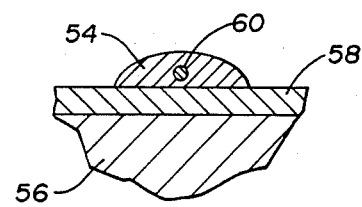
FIG. 6 is a cross-sectional view of the wire on the solder pad of FIG. 4 after the solder has reflowed.

The weight of the cone causes the wire to sink into the molten solder. After the laser shutter is closed, there should be a brief pause on the order of 0.015 seconds before raising cone 44 to enable the solder to solidify around wire 60. As shown in FIG. 6, the solder joints thus formed completely embed the wire within the solder pad. The joints are very strong and, since no flux is required, do not require cleaning. No voids are present and there is no breaking or necking down of the wire.

EXAMPLE

A Lumonics MS 810 laser 100 W pulsed Nd:YAG as described above was utilized. The process used an average power of 28 watts, 0.8 joule/pulse, peak power 160 watts/pulse and average focused power density of 219,000 watts/square inch was used. The flexible circuit substrate was Kapton brand polyimide and the solder pads were 63/37 tin, lead having a diameter of 0.045 inches (0.114 cm) and height of 0.0040–0.009 inches (0.010–0.023 cm). A 44 AWG, 0.002 inch diameter (0.005 cm) tough pitch, fully annealed copper wire having a polyurethane with nylon cover insulation was soldered to the pads.

A four inch (10.2 cm) focal point lens was used and the beam spot diameter was 0.0341 inches (0.0866 cm). The spot location was 0.050 inches (0.128 cm) above the focal point.

The soldering cone applied 0.014 pounds (0.006 kg) of force to the wire. Cone 44 had an outside diameter of 0.071 inches (0.108 cm) and an internal diameter opening diameter of 0.042 inches (0.107 cm).

Wire 60 was positioned within +/−0.013 inches (0.033 cm) from the center of the pads. The laser shutter is opened at coordinate a and remains on until it traverses a, b, c, d, e, f, b, a. In this example, "b" was 0.007 inches (0.018 cm) from "a". The beam movement distributes the laser energy. Soldering without moving the beam causes too much energy to be concentrated at one point resulting in broken wires and possible damage to the substrate. About 0.8 seconds of laser time is required per pad. The length of the square size will change depending on the wire and pad size. Also, the pause time increases with increased pad size.

It has been found that the vaporized plastic tends to build up in the interior of the cone and must be removed after about 100 solder joints have been made. The vaporized insulation is deposited within the cone rather than on the delicate microelectronic circuit workpieces.

The programmed movement of the X-Y-Z table causes the laser beam to traverse the path a, b, c, d, e, f, b, a as shown in FIG. 5. The beam spots size causes the spots to overlap, fully reflowing the solder with a minimum of time and heat. The polyimide/polyester flexible circuit is exposed to a minimum amount of heat from the laser due to the design of the system.

The laser soldering system of the invention provides very rapid, fluxless soldering of fine wires to solder pads on delicate components such as flexible circuits. Insulated wires may be soldered to the pads in one step. The wires are deeply sunk into the solder pad without necking down or breaking. The heat input to the solder pad is minimized to prevent damage to the surrounding portions of the workpiece. The unique cone serves to embed the wire, shield the workpiece from vaporized insulation and to decrease the transfer of heat input to the workpiece.

The system of the invention provides a means to cause the laser beam to automatically traverse a path about a solder pad which reflows the solder with minimal heat input.

In considering this invention, it must be remembered that the disclosure is illustrative only, and that the scope of the invention is to be determined by the claims.

What is claimed is:

1. Apparatus for soldering fine wires to a solder pad on a microelectronic workpiece, the apparatus comprising:
   (a) laser beam discharge means for soldering wires to a solder pad on a workpiece;
   (b) work station means including an X-Y-Z positioning fixture for aligning a laser beam from said laser beam discharge means upon a solder pad of a workpiece;
   (c) fixture means for holding a workpiece having solder pads such that said solder pads may be in alignment with said laser beam; and
   (d) said workstation means further including cone means including a cone constructed and arranged such that said laser beam passes through said cone, and said cone means including a cone holder constructed and arranged such that said cone may be positioned onto a wire placed over a solder pad such that said wire may be pushed into said solder pad solely by the weight of said cone when said solder pad is heated by a laser beam.

2. The apparatus of claim 1 further including conveyer means for moving workpieces having solder pads to a position in which said solder pads may be in alignment with said laser beam.

3. The apparatus of claim 1 wherein said cone means further includes a lens holder and lens, said lens holder and cone holder being rigidly connected to a table of said X-Y-Z positioning fixture.

4. A method for laser soldering flexible, insulated wire to solder pads on a workpiece; the method comprising the steps of:
   (a) conveying a workpiece to a laser station, said workpiece having flexible, insulated wire to be soldered positioned above a solder pad;
   (b) aligning a laser beam from said laser station over the wire and solder pad such that said wire is between said laser beam and said solder pad;
   (c) depressing a cone means through which said laser beams passes over said solder pad so as to press said wire against said solder pad;
   (d) applying a laser beam to said wire and solder pad to remove wire insulations and to solder said wire to said pad; and
   (e) removing the cone means from said pad after said laser beam is removed from said pad.

5. The method of claim 4 wherein said laser beam is applied to said solder pad such that said beam describes a rectangular path on said solder pad.

6. The method of claim 4 wherein said laser beam traverses a rectangular path by moving laser beam aligning mirrors affixed to an X-Y-Z positioning fixture.

7. The apparatus of claim 1 wherein said cone holder includes an aperture through which said cone may pass vertically due to gravity, said cone further including means for limiting vertical travel of said cone through said holder.

* * * * *